(12) United States Patent
Yamaguchi

(10) Patent No.: US 6,392,294 B1
(45) Date of Patent: May 21, 2002

(54) SEMICONDUCTOR DEVICE WITH STABLE PROTECTION COATING

(75) Inventor: Tomoji Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/464,488

(22) Filed: Dec. 15, 1999

(30) Foreign Application Priority Data

Dec. 22, 1998 (JP) .......................................... 10-364397

(51) Int. Cl.⁷ .......................... H01L 23/48; H01L 23/52
(52) U.S. Cl. ........................ 257/690; 257/698; 257/710; 257/787; 257/789
(58) Field of Search ................................ 257/690, 667, 257/687, 731, 781, 701, 691, 737, 787, 666, 702, 707, 710, 730, 788, 789, 795, 773, 774, 698, 697

(56) References Cited

U.S. PATENT DOCUMENTS

| | | | | |
|---|---|---|---|---|
| 5,136,366 A | * | 8/1992 | Worp et al. | 257/687 |
| 5,841,192 A | * | 11/1998 | Exposito | 257/701 |
| 5,909,054 A | * | 6/1999 | Kozono | 257/667 |

FOREIGN PATENT DOCUMENTS

| | | |
|---|---|---|
| JP | 8-125227 | 5/1996 |
| JP | 9-181359 | 7/1997 |
| JP | 09181359 | * 11/1997 |

* cited by examiner

Primary Examiner—Phat X. Cao
Assistant Examiner—Theresa T. Doan
(74) Attorney, Agent, or Firm—Merchant & Gould P.C.

(57) ABSTRACT

A semiconductor device is provided which includes an insulating substrate, a conductive terminal supported by the substrate, a semiconductor chip mounted on the substrate, and a protection coating for enclosing the chip. The protection coating is integrally formed with an anchoring portion. The substrate is formed with an engaging portion for engagement with the anchoring portion of the coating.

6 Claims, 18 Drawing Sheets

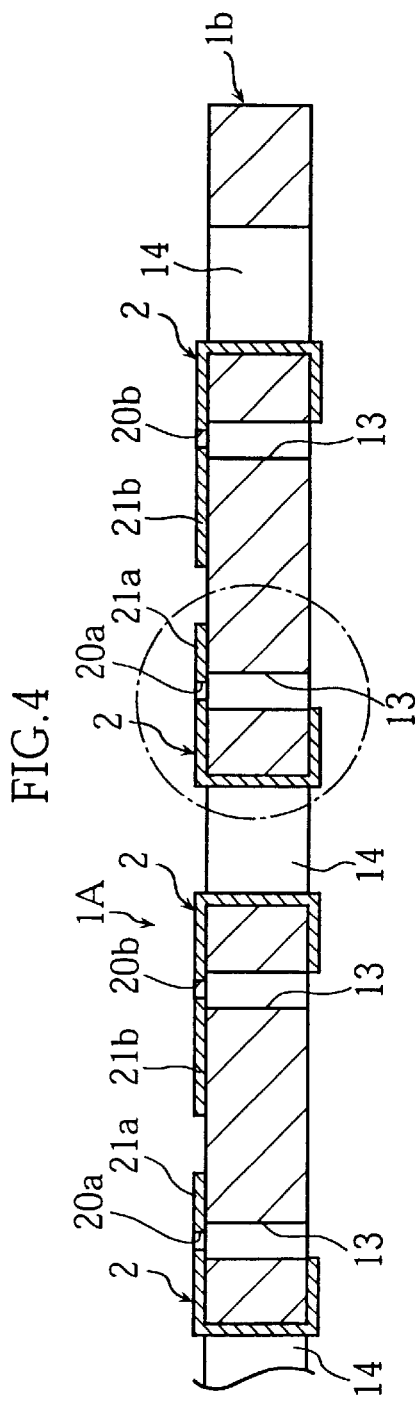
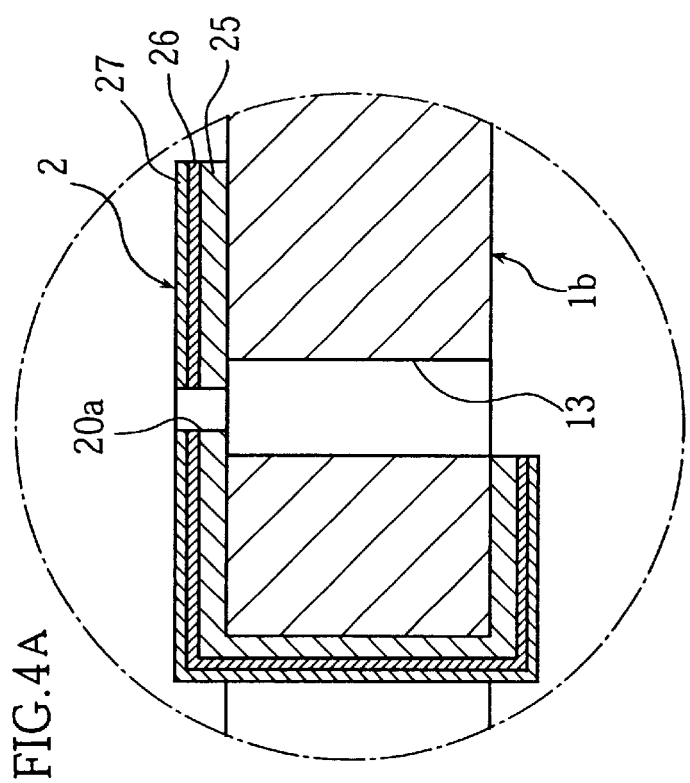
FIG.4
FIG.4A

SEMICONDUCTOR DEVICE WITH STABLE PROTECTION COATING

BACKGROUND OF THE INVENTION

1. Field of the Invention

The present invention relates to a surface mounting type semiconductor device. In particular, the present invention relates to a light-emitting diode of the above type which may advantageously be used as a backlight for a push button of a small electric appliance such as a portable telephone.

2. Description of the Related Art

Surface mounting type semiconductor devices, such as light-emitting diodes and transistors, have been used in various fields. FIG. 18 of the accompanying drawings shows an example of conventional light-emitting diode. The conventional diode Y includes a base unit 1 which is constituted by an elongated rectangular substrate 1a, a cathode 2A and an anode 2B. The substrate 1a is made of an insulating material, while the cathode 2A and the anode 2B are made of a metal piece plated with gold for example. The cathode 2A and the anode 2B are electrically insulated from each other, and each of these terminals extends from the upper surface 10 of the substrate 1a onto the lower surface 12 via a side surface 11. The diode Y also includes an LED chip 3 mounted on the upper portion 2a of the cathode 2A. The upper surface 30 of the LED chip 3 is electrically connected to the upper portion 2b of the anode 2B by a gold wire 4. The LED chip 3 and the wire 4 are enclosed by a resin coating 5 made of an epoxy resin applied on the base unit 1.

Though conveniently used, the conventional diode Y has been found disadvantageous in the following point. Since the cathode 2A and the anode 2B are made of metal, the resin coating 5 may not be firmly fixed to these terminals. This means that the bonding strength between the resin coating 5 and the base unit 1 substantially depends on the area of the disposed upper surface portion of the substrate 1a (i.e., the upper surface portion where the cathode 2A and the anode 2B are not formed).

For meeting the recent downsize requirements, the conventional diode Y has relatively small dimensions (1.6×0.8 mm or 1.0×0.5 mm in a plan view). Disadvantageously, in such a small diode, it is difficult to provide the base unit 1 with a sufficiently large surface area disposed to the exterior. Thus, in use, the resin coating 5 may rather readily be detached from the base unit 1, thereby causing damage to the LED chip 3 and the wire 4.

SUMMARY OF THE INVENTION

The present invention has been proposed under the above circumstances, and its object is to improve the bonding strength between a substrate and a protection coating in a small electronic device.

According to the present invention, there is provided a semiconductor device comprising:

an insulating substrate having obverse and reverse surfaces;

a conductive terminal supported by the substrate;

a semiconductor chip mounted on the obverse surface of the substrate and electrically connected to the terminal; and a protection coating arranged on the substrate for enclosing the chip, the protection coating being integrally formed with an anchoring portion;

wherein the substrate is formed with an engaging portion for engagement with the anchoring portion of the coating.

With such an arrangement, the anchoring portion of the coating can be firmly fitted into the engaging portion of the substrate. Thus, the protection coating is stabilized to the substrate even if the semiconductor device has a small size.

The semiconductor device may a light-emitting diode, a laser diode, a transistor and so forth.

According to a preferred embodiment of the present invention, the engaging portion of the substrate may be a through-hole in which the anchoring portion of the coating is received.

Preferably, the terminal may be formed with a bore communicating with the through-hole of the substrate.

In the above instance, the bore of the terminal may be smaller in diameter than the through-hole of the substrate.

With such an arrangement, the diametrically smaller bore of the terminal advantageously prevents the anchoring portion of the coating from being pulled out of the through-hole of the substrate. In this manner, the protection coating is more stably fixed to the substrate. The through-hole may be constant in diameter.

According to another preferred embodiment of the present invention, the through-hole may taper upward. Accordingly, the anchoring portion of the protection coating may have the same configuration. With such an arrangement, the anchoring portion is unremovably held in the engaging portion of the substrate.

Alternatively, the through-hole of the substrate may taper downward. With such an arrangement, part of a molten resin material supplied for producing the protection coating is readily introduced into the through-hole, thereby facilitating the forming of the anchoring portion of the resin coating.

According to another preferred embodiment of the present invention, the engaging portion of the substrate may be spaced from the terminal. In other words, the engaging portion may be disposed at a position where the terminal and the engaging portion do not overlap.

With such an arrangement, there is no need to provide the terminal with a bore communicating with the engaging portion. Thus, advantageously, the surface area and the volume of the terminal are prevented from being made unduly smaller.

Preferably, the engaging portion of the substrate may be a semicircular retreated portion located at an edge of the substrate.

According to another preferred embodiment of the present invention, the protection coating may be provided with an auxiliary fixing portion engaging with the reverse surface of the substrate. The auxiliary fixing portion may be connected to the anchoring portion of the coating.

With such an arrangement, the auxiliary fixing portion working together with the anchoring portion more reliably prevents the detachment of the protection coating from the substrate.

Preferably, the auxiliary fixing portion and the anchoring portion may be integrally formed with each other.

Preferably, the terminal may include a lower portion extending on the reverse surface of the substrate, and the lower portion of the terminal may be flush with the auxiliary fixing portion of the coating.

Advantageously, the substrate may be formed with another engaging portion, and the engaging portions of the substrate may be symmetrically disposed. Accordingly, the protection coating may be provided with another anchoring portion corresponding to the additional engaging portion.

With such an arrangement, due to the symmetrical arrangement of the engaging portions and the anchoring portions, the protection coating as a whole is attached to the substrate in a well-balanced manner.

Other objects, features and advantages of the present invention will become clearer from the following detailed description given with reference to the accompanying drawings.

BRIEF DESCRIPTION OF THE DRAWINGS

In the accompanying drawings:

FIG. 4–4A show sectional view taken along lines IV—IV in FIG. 3;

DETAILED DESCRIPTION OF THE PREFERRED EMBODIMENTS

Preferred embodiments of the present invention will be described below with reference to the accompanying drawings.

Figure 1:
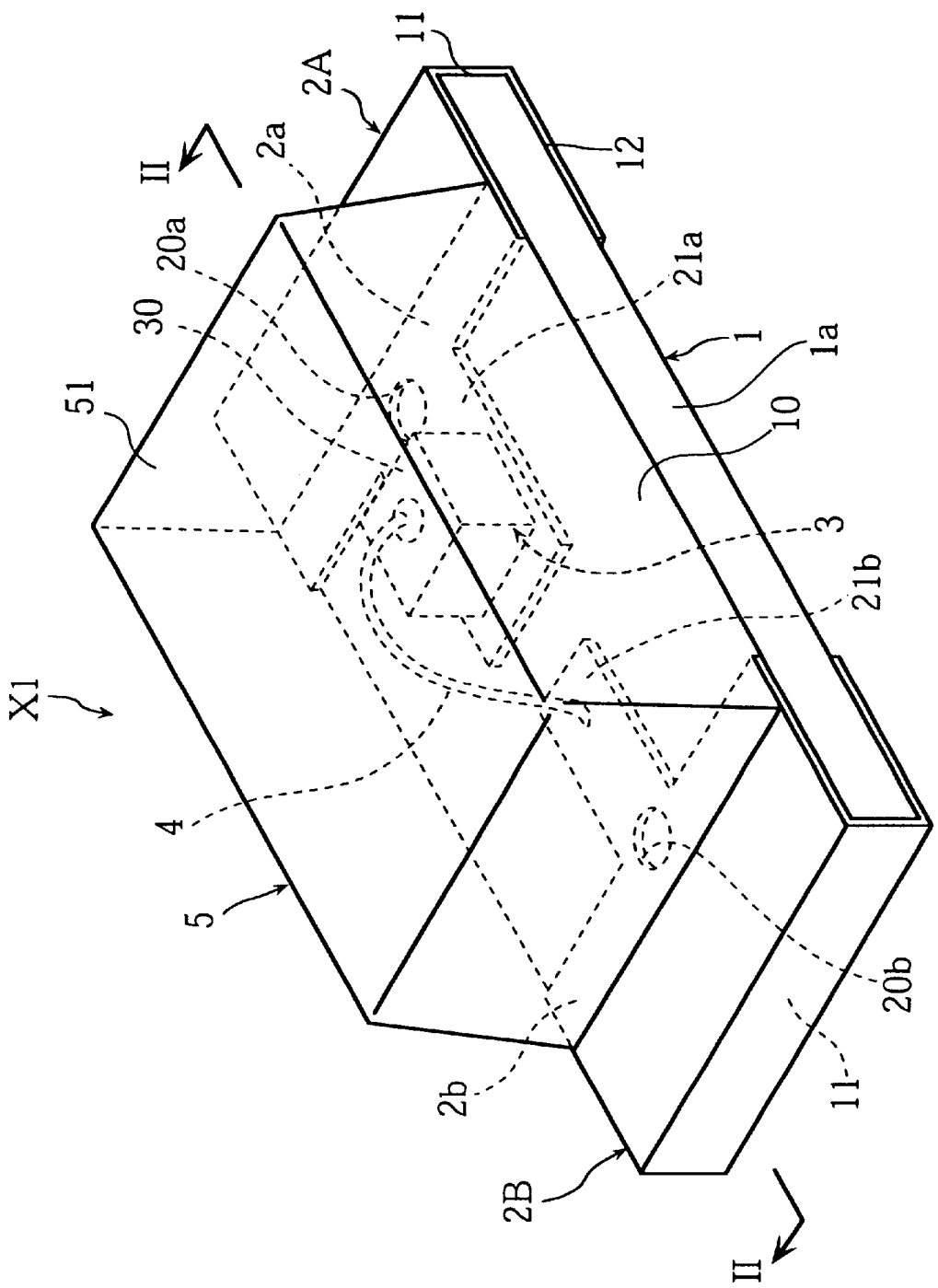
FIG. 1 is a perspective view showing the overall arrangement of a light-emitting diode according to a first embodiment of the present invention.
Figure 2:
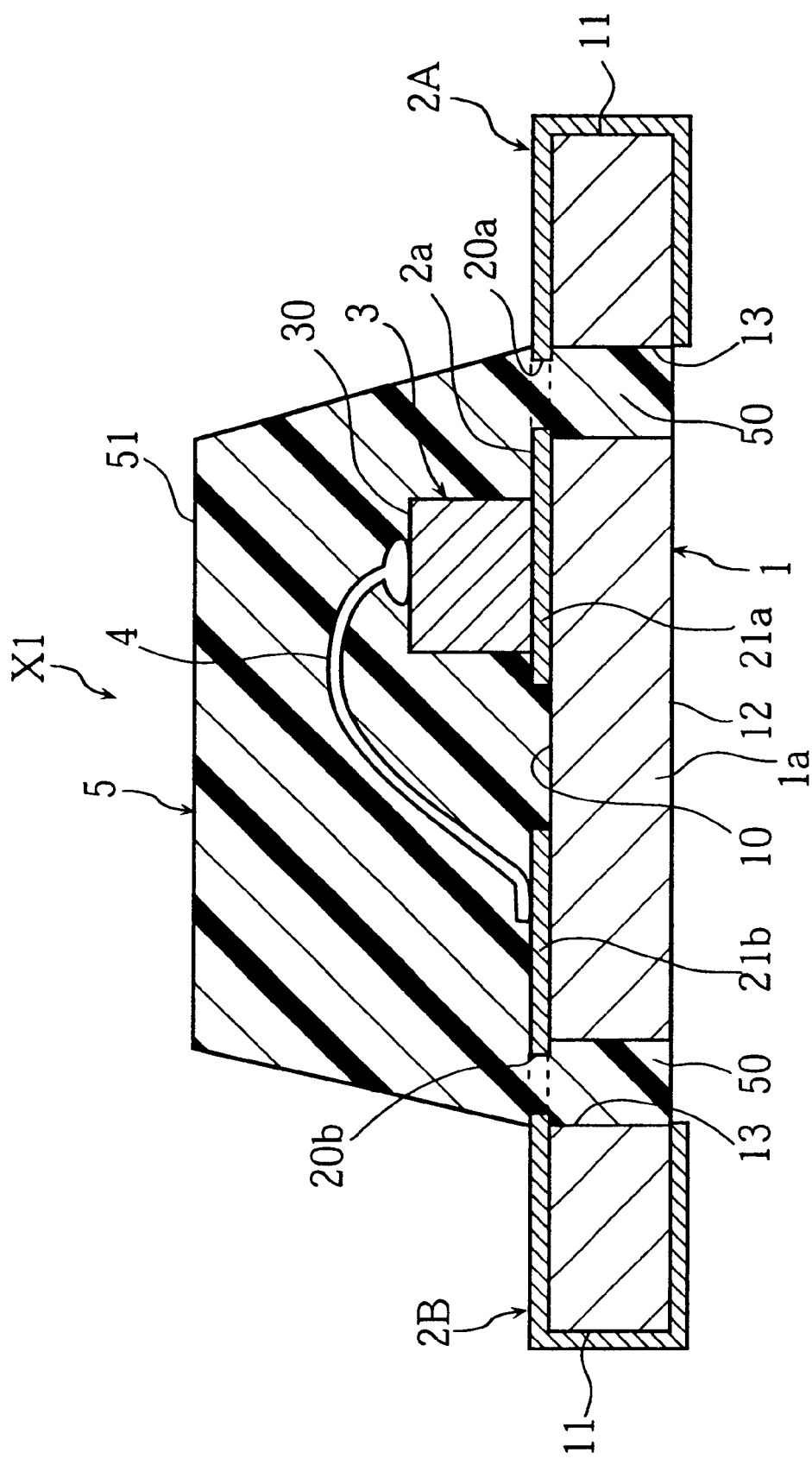
FIG. 2 is a sectional view taken along lines II—II in FIG. 1.

Reference is first made to FIGS. 1 and 2 showing a semiconductor device according to a first embodiment of the present invention. The illustrated semiconductor device X1 is a light-emitting diode (LED) which may advantageously be used as a backlight for illuminating a push button of a portable telephone. It should be noted, however, that the present invention is not limited to this but can be applied to other kinds of semiconductor devices.

The light-emitting diode X1 includes a base unit 1, an LED chip 3 and a resin coating 5. The base unit 1 is constituted by a rectangular insulating substrate 1a, a negative terminal or cathode 2A as an output terminal, and a positive terminal or anode 2B as an input terminal. The insulating substrate 1a may be made of a heat-resistant polyimide resin such as "BT resin (Trade Name)" or a suitable glass fabric. As shown in FIG. 2, the substrate 1a is formed with two through-holes 13 arranged at symmetrical positions in the substrate 1a. The through-holes 13 may be made by a conventional method using a laser beam, a drill, water jet or the like.

The cathode 2A and the anode 2B are formed on the substrate 1a, both extending from the upper surface 10 of the substrate 1a onto the lower surface 12 via a side surface 11. As a result, each of the cathode 2A and the anode 2B contains a folded-back portion enclosing an end portion of the substrate 1a.

The cathode 2A includes an upper part 2a disposed on the upper surface 10 of the substrate 1a. The upper part 2a is provided with a die-boding area 21a extending toward the anode 2B. The LED chip 3 is attached to the die-boding area 21a via silver paste for example. Similarly, the anode 2B includes an upper part 2b disposed on the supper surface 10 of the substrate 1a, and the upper part 2b is provided with a wire-bonding area 21b extending toward the cathode 2A. The wire-bonding area 21b is electrically connected to the upper surface 30 of the LED chip 3 by a wire 4 which is made of gold for example.

As shown in FIG. 1, the cathode 2A is formed with a bore 20a located adjacent to (or overlapping into) the die-boding area 21a, while the anode 2B is formed with a bore 20b located adjacent to (or overlapping into) the wire-bonding area 21b. As shown in FIG. 2, the two bores 20a, 20b correspond in position to the through-holes 13 of the substrate 1a, so that each of the bores 20a, 20b communicates with one of the through-holes 13. The diameter of the bores 20a, 20b is made smaller than that of the through-holes 13. Thus, the through-holes 13 are partially covered by the upper part 2a of the cathode 2A or the upper part 2b of the anode 2b.

The cathode 2A and the anode 2B may be produced by etching a layer of conductive metal (copper or nickel for example) provided on the substrate 1a. In this etching process, the two bores 20a, 20b may also be formed. Thereafter, the cathode 2A and the anode 2B may be subjected to nickel-plating or gold-plating by an electroplating technique. In this manner, the cathode 2A and the anode 2B advantageously become resistant to oxidation. Another advantage of performing the plating is that the wire 4 can be firmly attached to the cathode 2B.

As shown in FIG. 2, the resin coating 5 has a body 51 formed on the upper side of the base unit 1, and a plurality of anchoring portions 50 fitted in the through-holes 13 of the substrate 1a. As viewed longitudinally of the base unit 1, the body 51 is located in a central area of the unit (see also FIG. 1). In this position, the body 51 entirely encloses the LED chip 3 and the wire 4. On the other hand, the body 51 partially encloses the cathode 2A and the anode 2B, so that the folded-back portions of the two terminals are exposed to the exterior.

The illustrated resin coating 5 may be prepared by e.g. a transfer molding technique. For performing this method, use is made of a thermosetting resin (such as epoxy resin), which is forced into a metal mold in a molten state and then solidified. Part of the molten resin material supplied into the metal mold will flow into the through-holes 13 of the substrate 1a and fill up the holes. In this manner, the anchoring portions 50 are formed integrally with the body 51.

In the light-emitting diode X1, as described above, the anchoring portions 50 of the resin coating 5 are fitted into the through-holes 13 of the substrate 1a. In this manner, the resin coating 5 is firmly fixed to the substrate 1a. Thus, when the contacting area between the resin coating 5 and the base unit 1 (or the substrate 1a) is reduced to meet requirements of downsizing the light-emitting diode X1, detachment of the resin coating 5 from the base unit 1 is advantageously prevented.

Reference is now made to FIGS. 3–7 illustrating a method of producing the above light-emitting diode X1.

Figure 3:
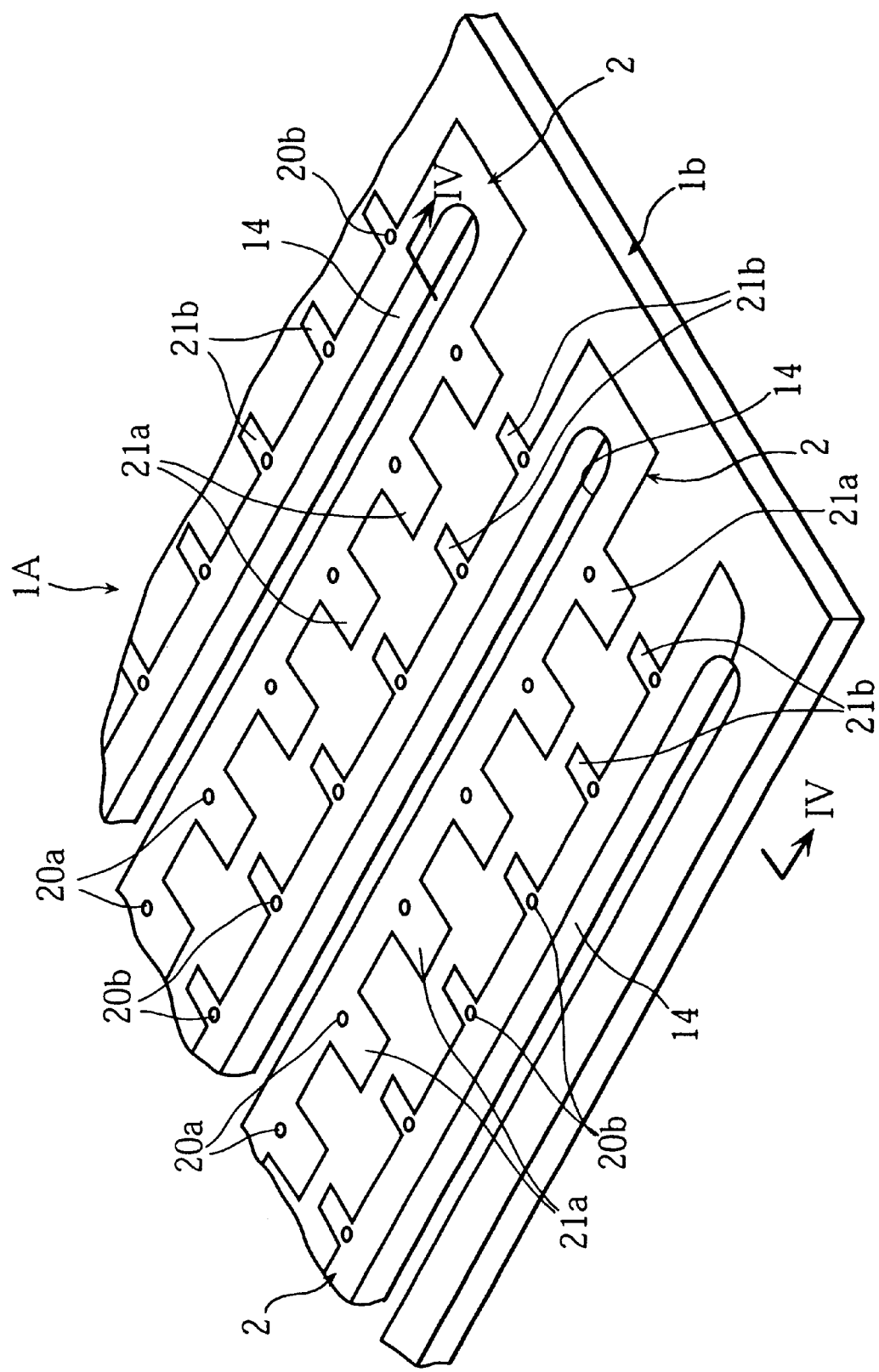
FIG. 3 is a perspective view showing principal parts of a matrix board used for producing the light-emitting diode of FIG. 1.

First, a matrix board 1A as shown in FIG. 3 is prepared. The matrix board 1A is constituted by a rectangular insulating plate 1b and metal conductors 2 formed on the plate 1b. The insulating plate 1b may be made of a polyimide resin (such as BT resin) or glass fabric for example. As shown in FIGS. 3 and 4, the plate 1b is formed with a plurality of parallel slits 14 disposed at regular intervals. The plate 1b is also formed with a plurality of through-holes 13 (see FIG. 4) arranged at predetermined positions.

As shown in FIGS. 3 and 4–4A, the metal conductors 2 are formed at a corresponding one of the slits 14. In section (FIG. 4–4A), each conductor 2 extends from the upper surface of the plate 1b onto the lower surface thereof via the inner surface of the slit 14. As shown in FIG. 4–4A, the metal conductor 2 is made up of three layers, that is, a lower copper layer 25, an intermediate nickel layer 26 and an upper gold-plated layer 27. The metal conductor 2 includes a plurality of die-bonding portions 21a and a plurality of wire-bonding portions 21b. The metal conductor 2 is also formed with a plurality of bores 20a, 20b.

The matrix board 1A described above may be obtained in the following manner. First, the parallel slits 14 are formed in the insulating plate 1b by using a suitable cutting tool. Then, a layer of copper is formed on the plate 1b by sputtering or evaporation. This layer is subjected to etching processes to remove unnecessary portions (at this stage, the bores 20a, 20b are formed). Then, the surface of the remaining copper layer is subjected to nickel-plating and further to gold-plating. The thicknesses of the copper layer 25, the nickel layer 26 and the gold layer 27 may be 18–33 $\mu$m, about 5 $\mu$m and about 0.3 $\mu$m, respectively.

Finally, the through-holes 13 are made at particular positions corresponding to the bores 20a, 20b. For this purpose, use may be made of a laser drilling technique. Specifically, a laser beam emitted from below the substrate 1a is caused to strike the above-mentioned particular positions of the substrate 1a, so that the through-holes 13, held in communication with the bores 20a or 20b, are formed. The output energy of the laser beams is rendered adjustable, so that only the particular portions of the plate 1b are removed by the laser beams, whereas the metal conductor 2 remains intact.

Figure 5:
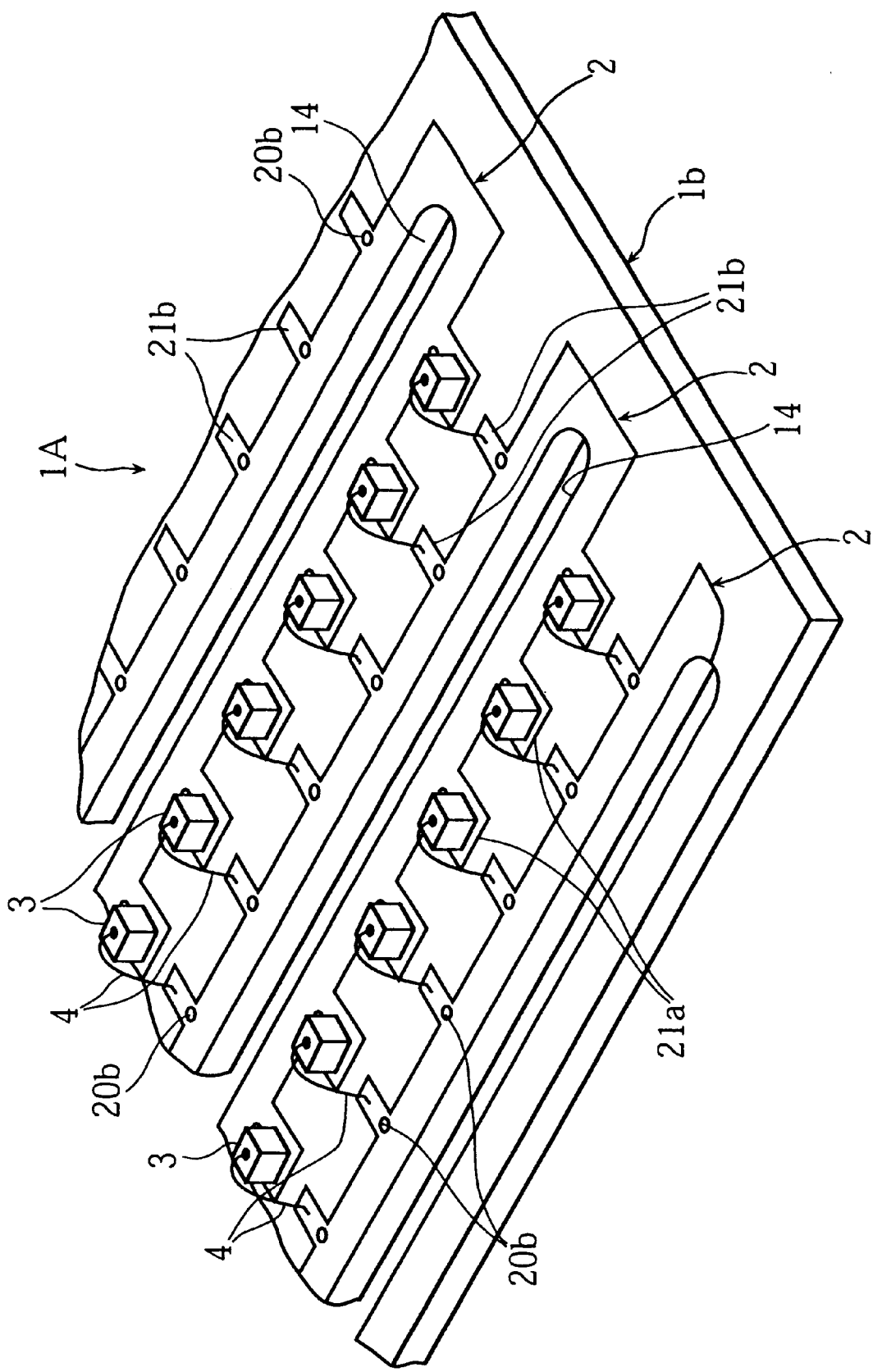
FIG. 5 is a perspective view showing the matrix board with a plurality of LED chips mounted thereon.

After the matrix board 1A shown in FIGS. 3 and 4–4A is prepared, LED chips 3 are mounted onto the die-bonding areas 21a of the conductor 2 (one LED chip 3 for one die-bonding area 21a), as shown in FIG. 5. Though not illustrated, each LED chip 3 is fixed to the die-bonding area 21a via e.g. silver paste. Then, the upper surface of each LED chip 3 is electrically connected to a corresponding wire-bonding area 21b via the gold wire 4.

Figure 6:
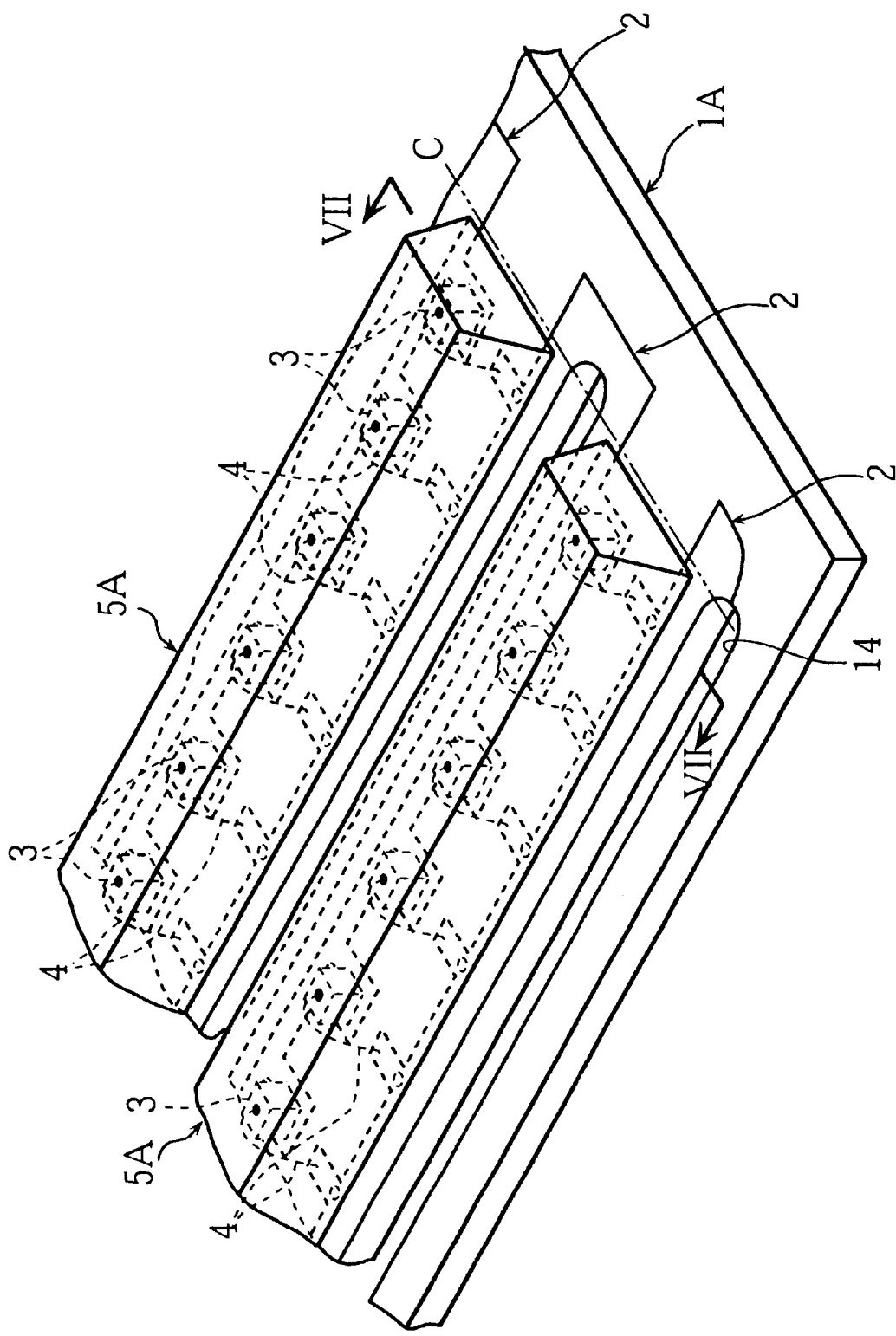
FIG. 6 is a perspective view showing the matrix board coated by resin material.
Figure 7:
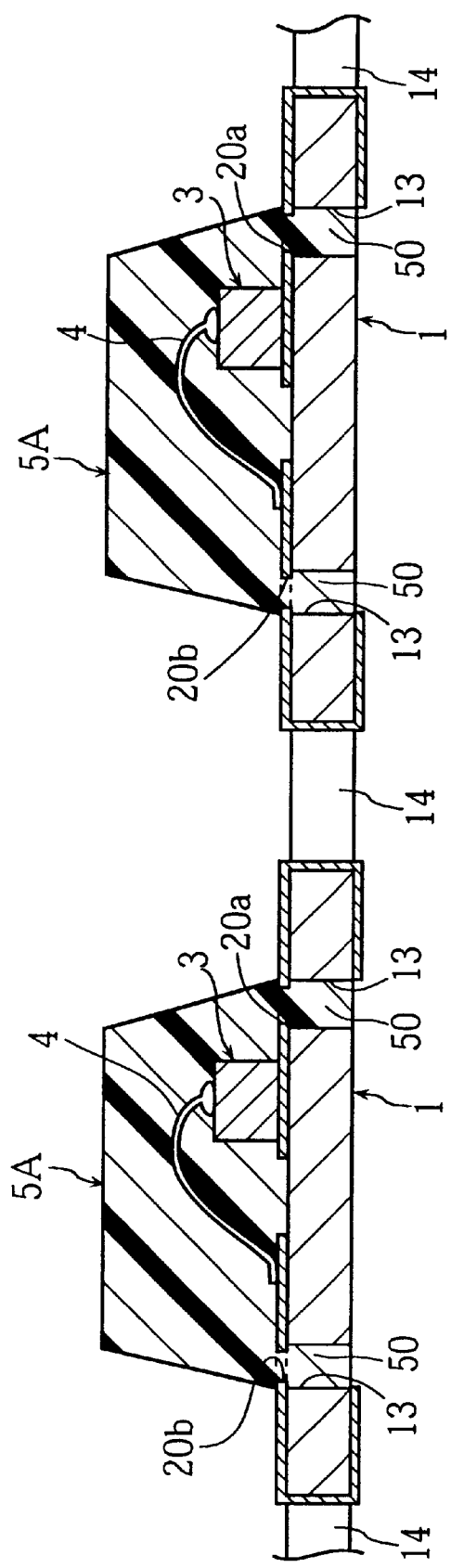
FIG. 7 is a sectional view taken along lines VII—VII in FIG. 6.

Then, as shown in FIGS. 6 and 7, the LED chips 3 and the wires 4 are enclosed by resin coatings 5A which are provided on the upper surface of the matrix board 1A. Each resin coating 5A has an elongated configuration extending between the adjacent slits 14 (FIG. 6), thereby containing plural LED chips 3 disposed between the slits 14. These resin coatings 5A may be formed by a transfer molding method. Since the through-holes 13 of the substrate 1b are held in communication with the bores 20a, 20b of the metal conductor 2, a molten resin applied onto the upper surface of the matrix board 1A is introduced into the through-holes 13, thereby providing the anchoring portions 50 fitted into the through-holes 13, as shown in FIG. 7.

With such an arrangement, no additional metal mold is needed for producing the anchoring portions 50. This means that a conventionally available metal mold may suffice for formation of the anchoring portions 50. Thus, a problem of cost increase will not occur.

Then, as shown in FIG. 6, a cut is made in the matrix board 1A along a cut line C (double-dot chain line), thereby providing a plurality of intermediate products each of which contains plural light-emitting diodes. Finally, cuts are made between adjacent LED chips 3 of each intermediate product to provide individual light-emitting diodes X1 as shown in FIG. 1.

Figure 8:
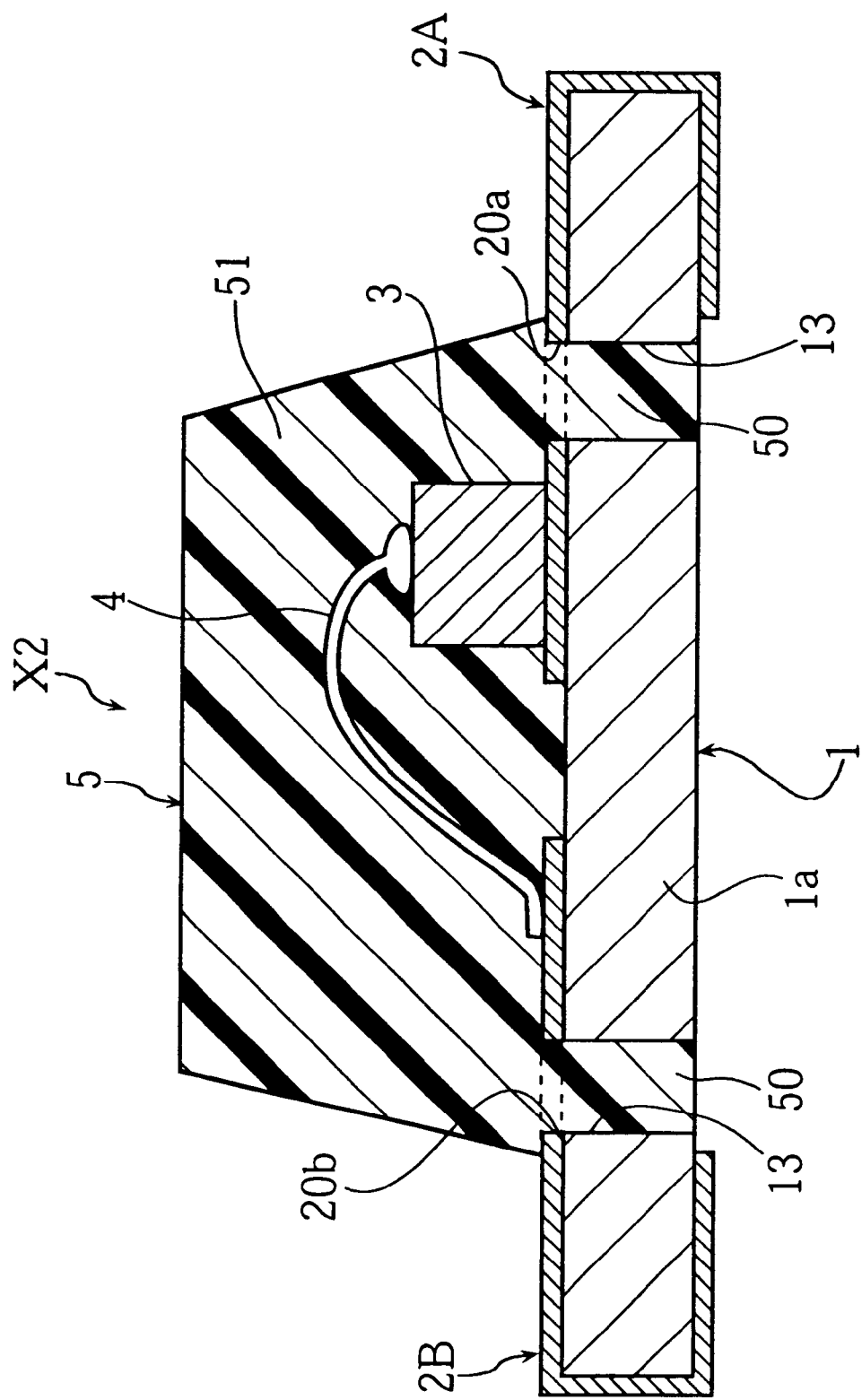
FIG. 8 is a sectional view showing a modified version of the light-emitting diode of FIG. 1.

In the light-emitting diode X1, the through-holes 13 of the substrate 1a are made greater in diameter than the bores 20a, 20b of the cathode 2A and the anode 2B. Differing from this, the through-holes 13 can be made equal in diameter to the bores 20a, 20b of the cathode 2A and the anode 2B, as in a light-emitting diode X2 of FIG. 8.

Figure 9:
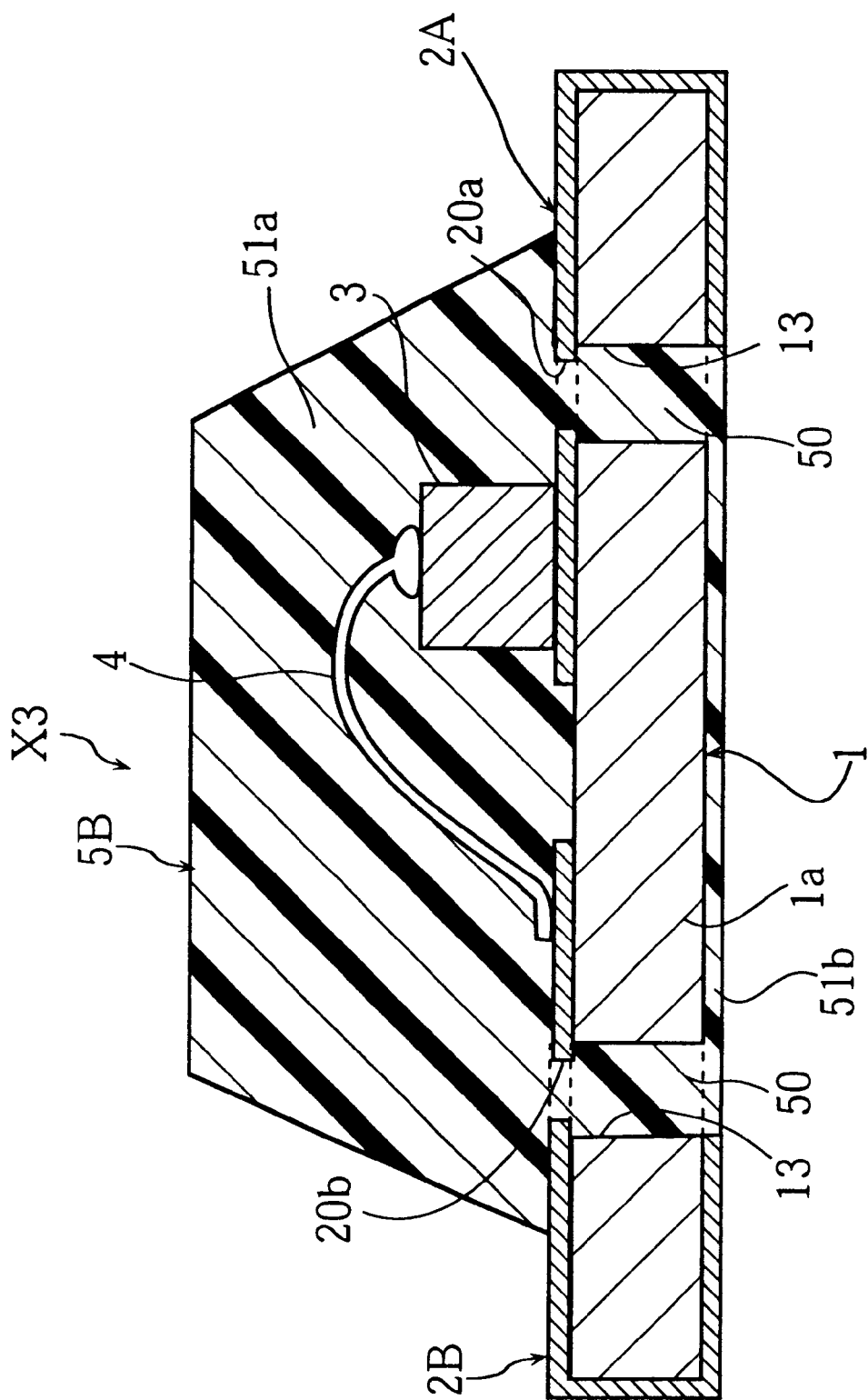
FIG. 9 is a sectional view showing a light-emitting diode according to a second embodiment of the present invention.

Reference is now made to FIG. 9 illustrating a light-emitting diode X3 according to a second embodiment of the present invention.

As seen from the figure, the basic arrangements of the light-emitting diode X3 are similar to those of the light-emitting diode X1, except that a resin coating 5B includes an auxiliary fixing portion 51b extending on part of the bottom surface of an insulating substrate 1a. The auxiliary fixing portion 51b is substantially equal in thickness to a cathode 2A (and an anode 2B). Thus, the lower surface of the auxiliary fixing portion 51b is flush with the lower surface of the cathode 2A (and the anode 2B).

As shown in FIG. 9, the auxiliary fixing portion 51b is integrally connected to anchoring portions 13 which in turn are integrally connected to a primary resin portion (or body) 51a. Thus, the body 51a, the anchoring portions 13 and the auxiliary fixing portion 51b are integrally formed as a single piece. The auxiliary fixing portion 51b may be simultaneously formed together with the body 51a and the anchoring portions 50 by a transfer molding method using upper and lower molding members. The resin coating 5B is produced in the following manner.

First, the base unit 1 is sandwiched between the upper and lower molding members. In this state, an upper space is defined between the base unit 1 and the upper molding member, while a lower space is defined between the base unit 1 and the lower molding member. It should be noted that the upper and the lower spaces are communicated with each other via the through-holes 13 and the bores 20a–20b. Then, a molten resin material is poured into the upper space defined between the base unit 1 and the upper molding member. The resin material supplied into the upper space will be introduced into the through-holes 13 and further into the lower space. As readily understood, the resin material brought into the second space will serve as the auxiliary fixing portion 51b after it is solidified.

With the arrangements illustrated in FIG. 9, the body 51a is more stably attached to the substrate 1a, as compared to the body 51 of the first embodiment (see FIG. 2).

Figure 10:
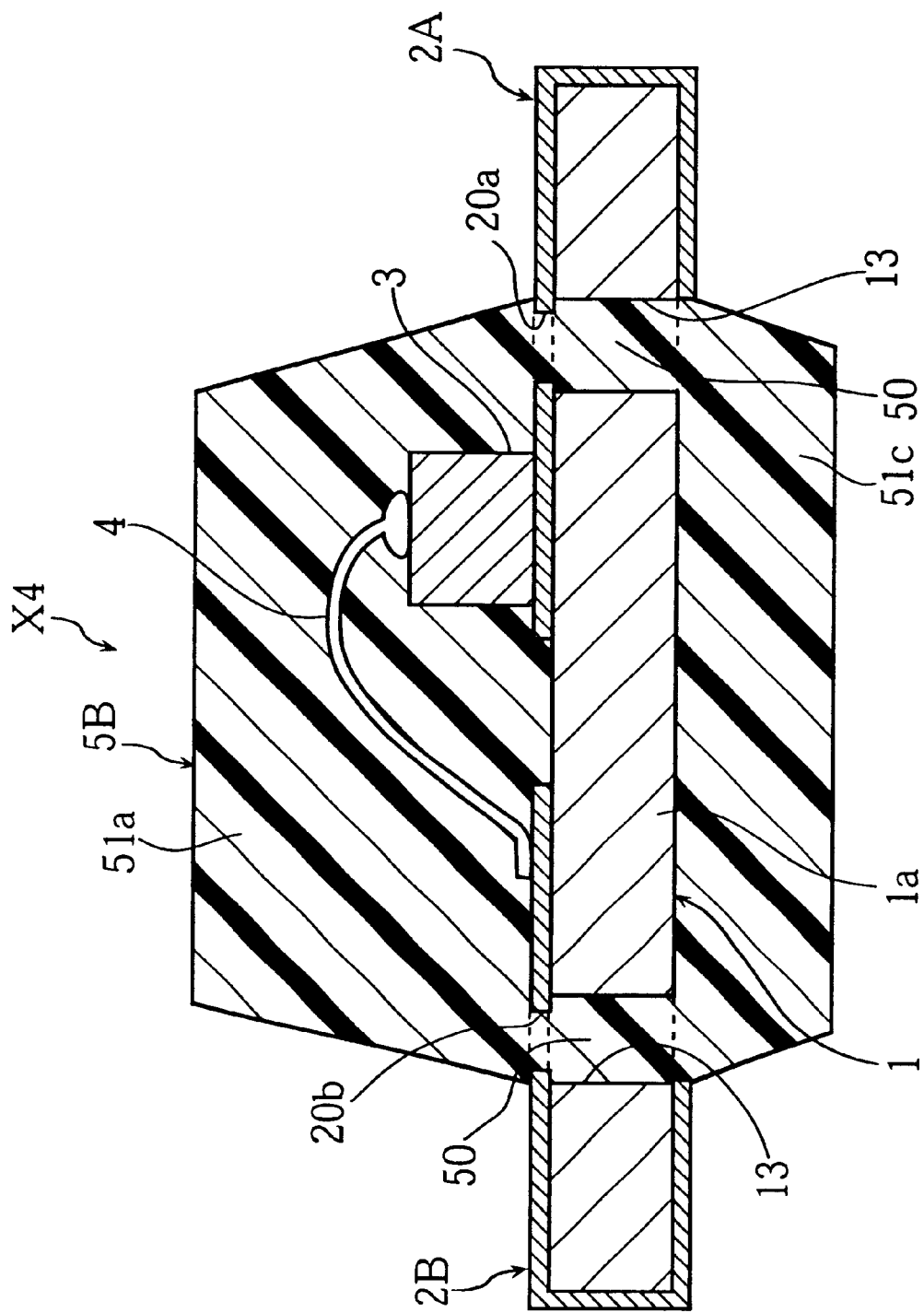
FIG. 10 is a sectional view showing a modified version of the light-emitting diode of FIG. 9.

FIG. 10 shows a modified version of the light-emitting diode X3. The illustrated light-emitting diode X4 has a resin coating 5B including a relatively bulky auxiliary fixing portion 51c. As shown, the auxiliary fixing portion 51c protrudes downward to a predetermined extent. With such an arrangement again, a body 51a of the resin coating 5B is firmly attached to an insulating substrate 1a.

Figure 11:
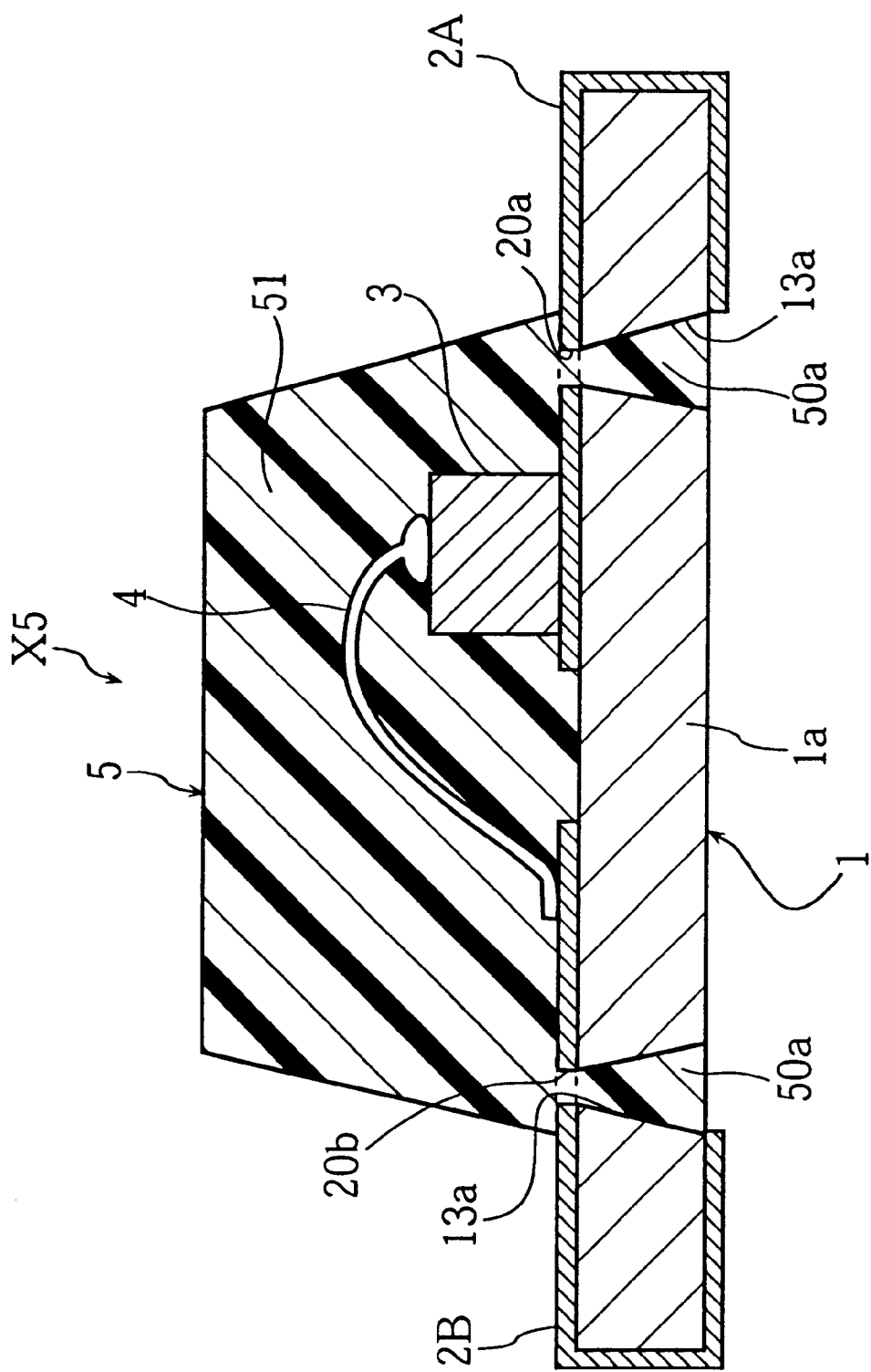
FIG. 11 is a sectional view showing a light-emitting diode according to a third embodiment of the present invention.

Reference is now made to FIG. 11 illustrating a light-emitting diode according to a third embodiment of the present invention.

The basic arrangements of the illustrated light-emitting diode X5 are similar to those of the light-emitting diode X1 of the first embodiment, except for the configuration of through-holes 13a of an insulating substrate 1a. Specifically, the through-hole 13a of the third embodiment becomes larger in diameter, as proceeding from the upper opening to the lower opening. In other words, the through-hole 13a has a downwardly flaring configuration or upwardly tapering configuration. Accordingly, anchoring portions 50a of a resin coating 5 are made into the same flaring shape as the through-holes 13a. With such an arrangement, the anchoring portions 50a cannot (or at least not easily) be pulled out of the through-holes 13a, whereby the resin coating 5 is firmly attached to the substrate 1a.

In the light-emitting diode X5, bores 20a, 20b formed in a cathode 2A or an anode 2B are equal in diameter to the upper openings of the through-holes 13a. Alternatively, the bores 20a, 20b may be diametrically smaller than the upper openings of the through-holes 13a.

Figure 12:
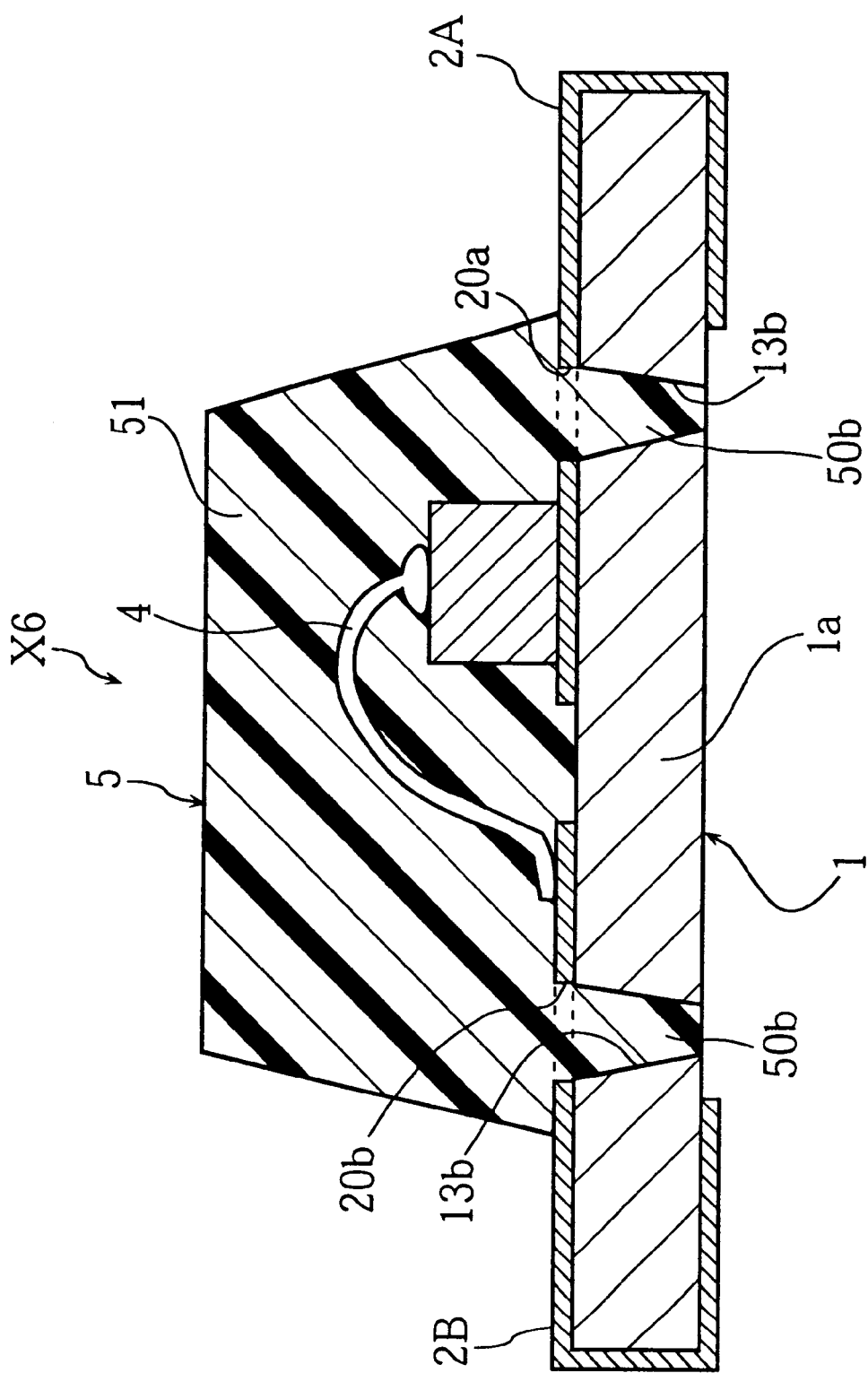
FIG. 12 is a sectional view showing a modified version of the light-emitting diode of FIG. 11.

FIG. 12 shows a modified version of the light-emitting diode X5 shown in FIG. 11. The modified light-emitting diode X6 is basically similar to the diode X5 of FIG. 11, except that the posture of through-holes 13b is turned upside down. Specifically, the through-hole 13b of FIG. 12 becomes greater in diameter, as proceeding from the lower opening to the upper opening.

With such an arrangement, a molten resin material, which is supplied onto the upper surface of a base unit 1 for forming the resin coating 5, will easily be introduced into the through-holes 13b. The resin material filled in the through-holes 13b is solidified to provide downwardly tapering anchoring portions 50b.

Though not shown in FIG. 12, an auxiliary fixing portion (see FIG. 9) connected to the anchoring portions 50b may be provided to extend on part of the bottom surface of the substrate 1a. It is possible in this way to prevent the resin coating 5 from being detached from the substrate 1a.

Figure 13:
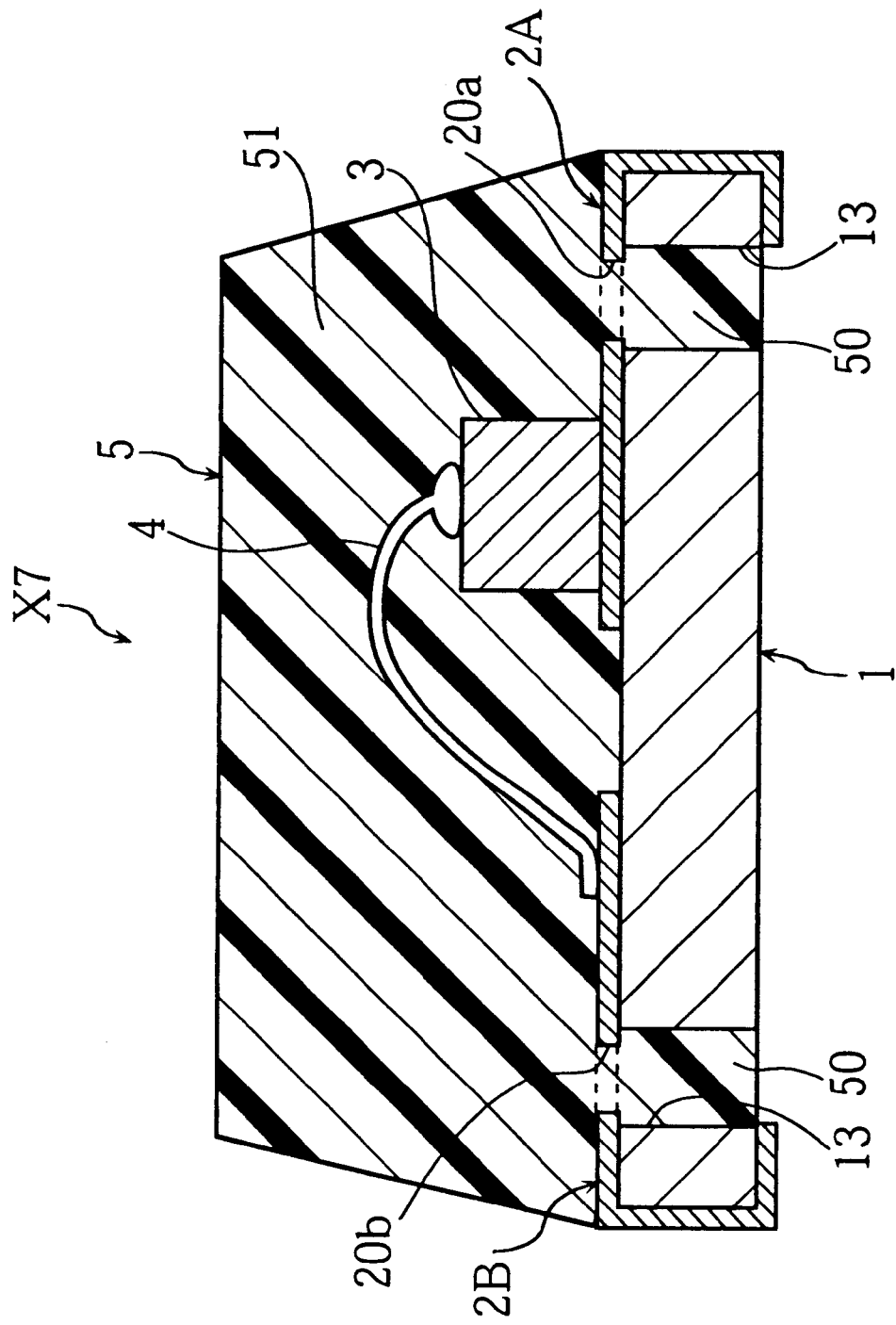
FIG. 13 is a sectional view showing a light-emitting diode according to a fourth embodiment of the present invention.

FIG. 13 shows a light-emitting diode according to a fourth embodiment of the present invention. The illustrated light-emitting diode X7 is similar to the light-emitting diode X1 (see FIG. 2), except that a base unit 1 does not laterally protrude from a resin coating 5. Thus, as viewed from above (or below), the resin coating 5 and the base unit 1 have the same size. With such an arrangement again, the resin coating 5 is stably attached to a substrate 1a by causing anchoring portions 50 to be fitted into through-holes 13 of the substrate 1a.

Figure 14:
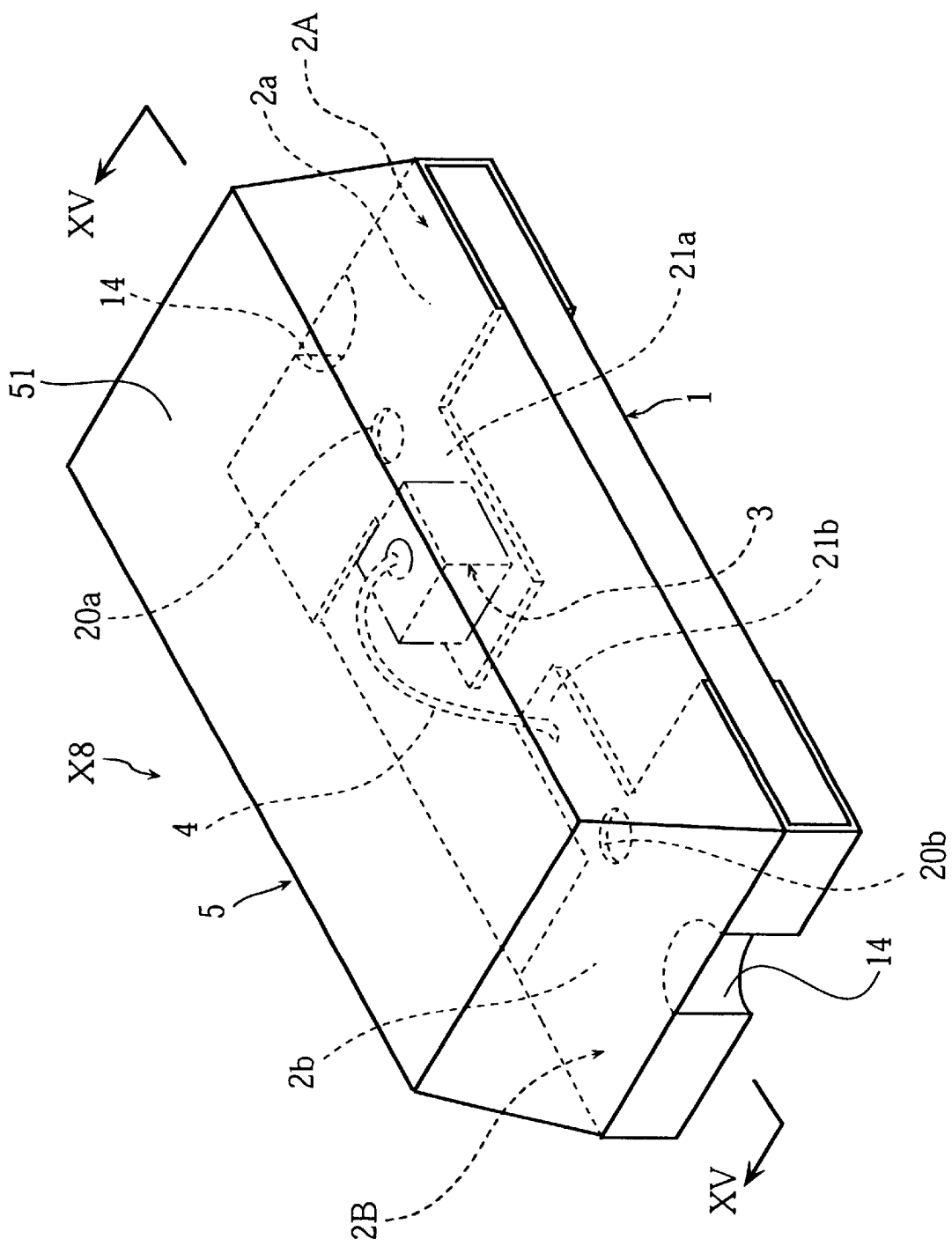
FIG. 14 is a sectional view showing a modified version of the light-emitting diode of FIG. 13.
Figure 15:
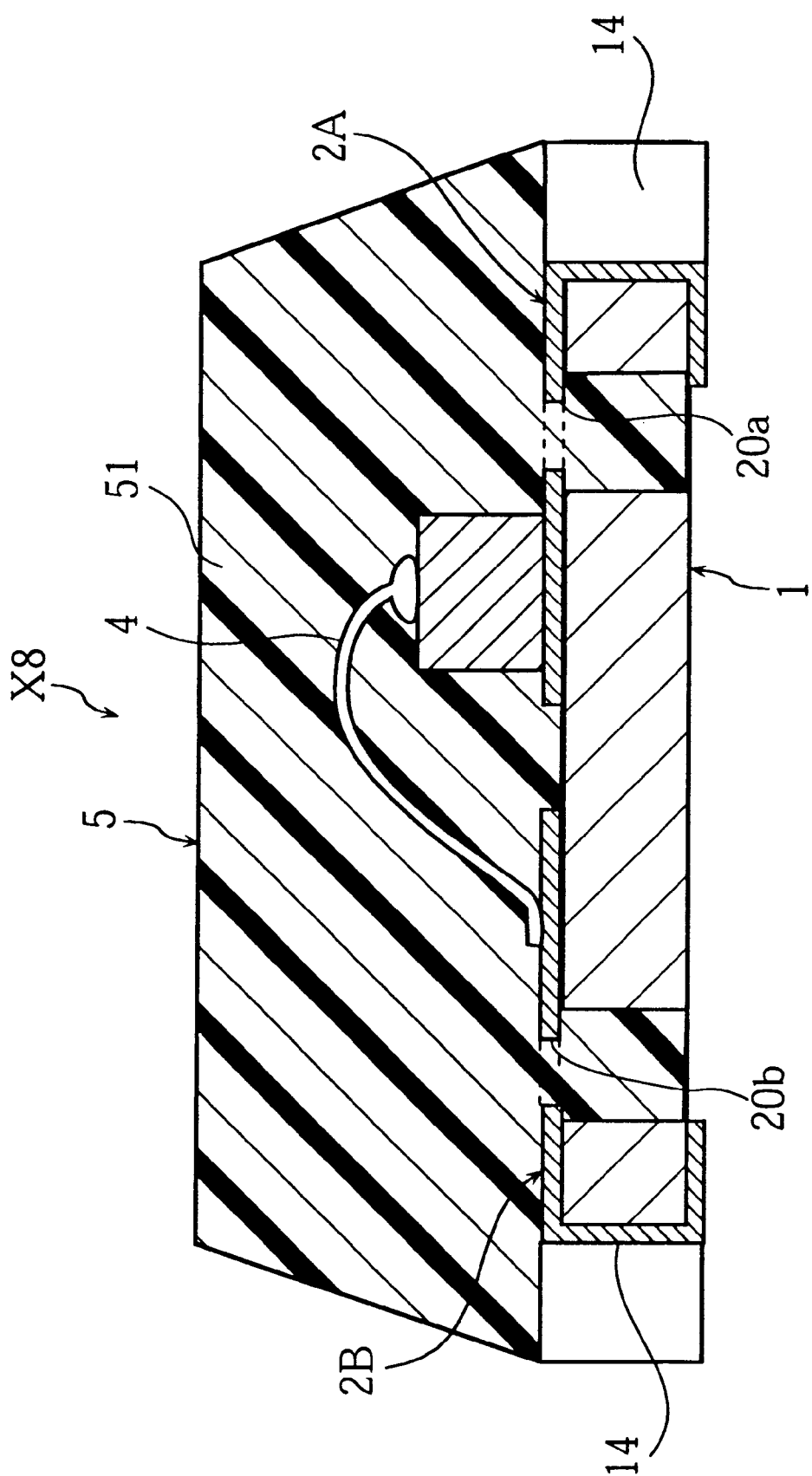
FIG. 15 is a sectional view taken along lines XV—XV in FIG. 14.

FIGS. 14 and 15 show a modified version of the light-emitting diode X7 of FIG. 13. The illustrated light-emitting diode X8 is provided with two retreated portions 14 for facilitating the soldering of the diode X8 to e.g. a printed circuit board (not shown). The retreated portions 14 are arranged at the longitudinal ends of the base unit 1, one retreated portion 14 for a cathode 2A and the other retreated portion 14 for an anode 2B. Such retreated portions for performing soldering may be formed in the light-emitting diodes X1–X6.

Figure 16:
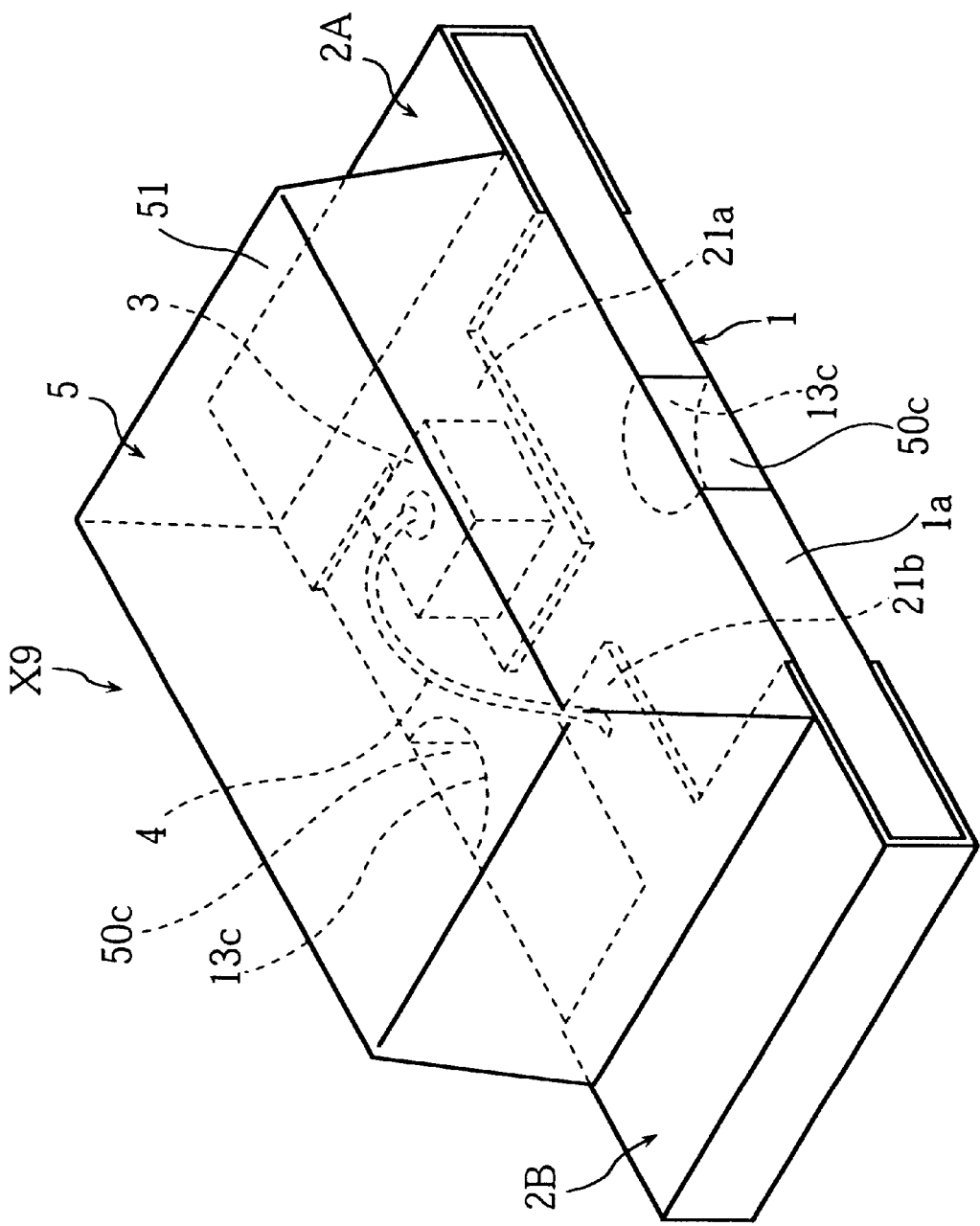
FIG. 16 is a perspective view showing a light-emitting diode according to a fifth embodiment of the present invention.

FIG. 16 shows a light-emitting diode according to a fifth embodiment of the present invention. Differing from the previous diodes X1–X8, the illustrated light-emitting diode X9 is not provided with through-holes at positions corresponding to a cathode 2A or an anode 2B. Instead, the diode X9 is formed with semicircular retreated portions 13c for coming into engagement with semicircular anchoring portions 50c of a resin coating 5. In the illustrated example, the semicircular retreated portions 13c are disposed at longitudinal edges of an insulating substrate 1a. Alternatively, through-holes may be formed in the substrate 1a at positions spaced from both the longitudinal edges and the terminals 2A, 2B.

Figure 17:
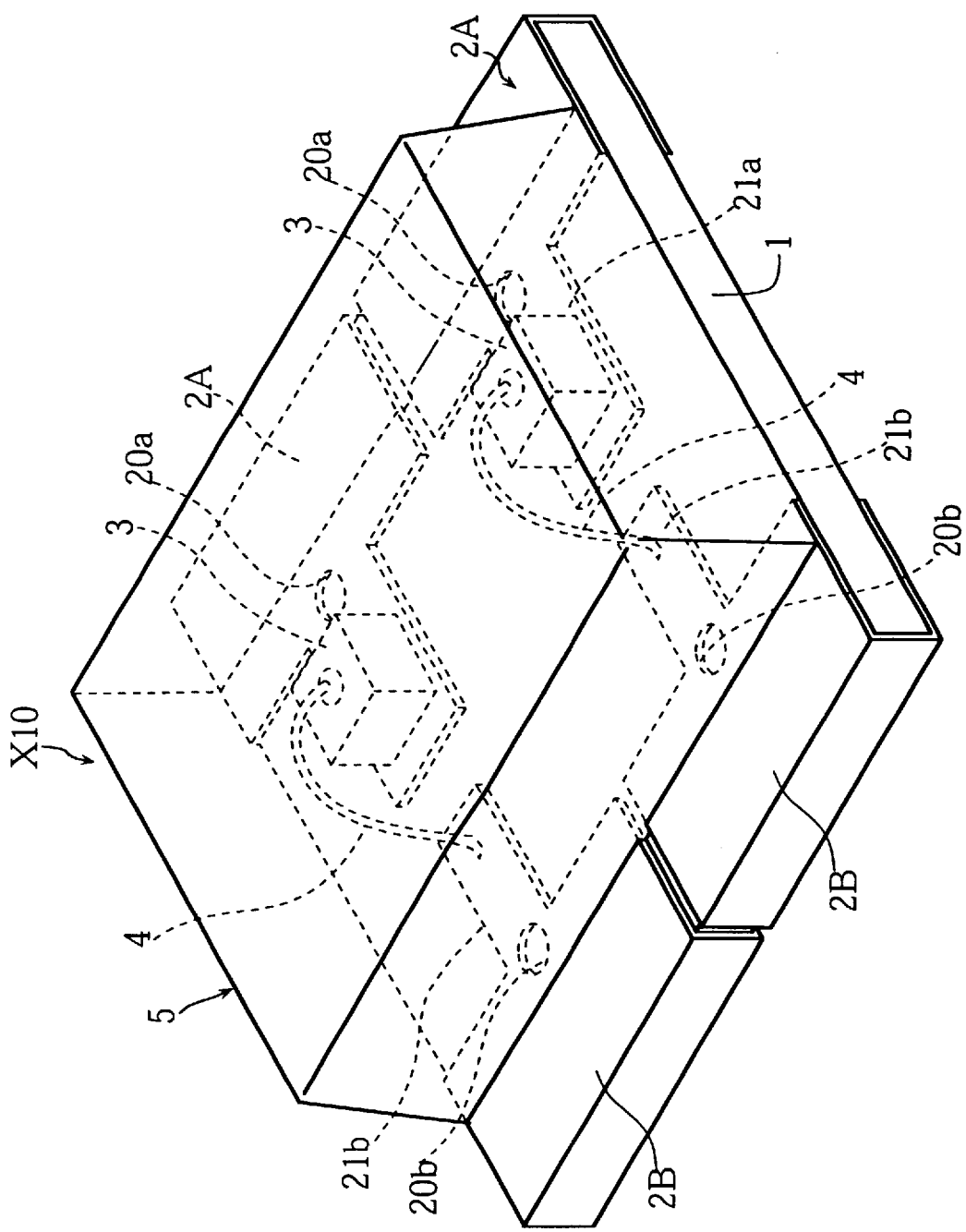
FIG. 17 is a perspective view showing a light-emitting diode according to a sixth embodiment of the present invention.
Figure 18:
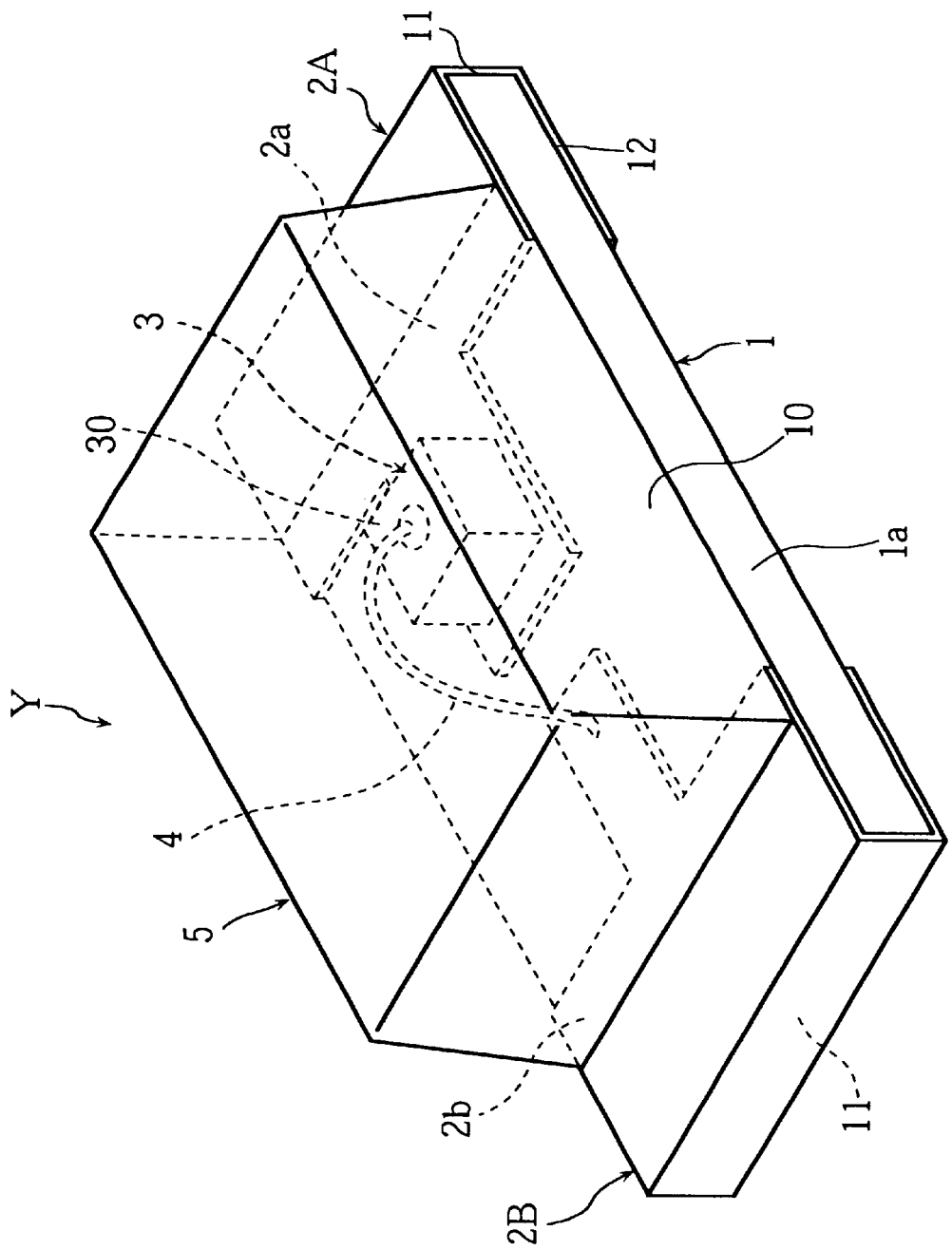
FIG. 18 is a perspective view showing a conventional light-emitting diode.

FIG. 17 shows a light-emitting diode according to a sixth embodiment of the present invention. The illustrated diode X10 is made up of two LED chips 3 enclosed by a single resin coating 5. Each LED chip 3 is connected to a cathode 2A and an anode 2B. The two cathodes 2A (the two anodes 2B as well) are juxtaposed but spaced from each other. If the diode X10 is divided in half between the cathodes 2A, this may provide two separate light-emitting diodes as shown in FIG. 1.

In the above embodiment, two LED chips 3 are used for producing a single semiconductor device. Alternatively, three or more LED chips may be used.

The present invention being thus described, it is obvious that the same may be varied in many other ways. Such variations are not to be regarded as a departure from the spirit and scope of the present invention, and all such modifications as would be obvious to those skilled in the art are intended to be included within the scope of the following claims.

What is claimed is:
1. A semiconductor device comprising:
an insulating substrate having obverse and reverse surfaces;
a conductive terminal supported by the substrate and formed with a bore;
a semiconductor chip mounted on the obverse surface of the substrate and electrically connected to the terminal; and
a protection coating arranged on the substrate for enclosing the chip, the protection coating being integrally formed with an anchoring portion;
a protection coating arranged on the substrate for enclosing the chip, the protection coating being integrally formed with an anchoring portion;
wherein the substrate is formed with a through-hole in which the anchoring portion of the coating is received, the through-hole communicating with the bore of the terminal; and
wherein the bore of the terminal is smaller in diameter than the through-hole of the substrate for causing the conductive terminal to overhang above the through-hole.
2. The semiconductor device according to claim 1, wherein the through-hole is constant in diameter.

3. The semiconductor device according to claim 1, wherein the protection coating is provided with an auxiliary fixing portion engaging with the reverse surface of the substrate, the auxiliary fixing portion being connected to the anchoring portion of the coating.

4. The semiconductor device according to claim 3, wherein the auxiliary fixing portion and the anchoring portion are integrally formed with each other.

5. The semiconductor device according to claim 3, wherein the terminal includes a lower portion extending on the reverse surface of the substrate, the lower portion of the terminal being flush with the auxiliary fixing portion of the coating.

6. The semiconductor device according to claim 1, wherein the substrate is formed with another through-hole, the through-holes of the substrate being symmetrically disposed.

* * * * *